(12) United States Patent
Itoh et al.

(10) Patent No.: US 6,358,770 B2
(45) Date of Patent: Mar. 19, 2002

(54) METHOD FOR GROWING NITRIDE SEMICONDUCTOR CRYSTALS, NITRIDE SEMICONDUCTOR DEVICE, AND METHOD FOR FABRICATING THE SAME

(75) Inventors: Kunio Itoh, Kyoto; Masahiro Ishida, Osaka, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/758,287

(22) Filed: Jan. 12, 2001

(30) Foreign Application Priority Data

May 29, 1998 (JP) ............................ 10-148997
May 29, 1998 (JP) ............................ 10-148998

(51) Int. Cl.$^7$ ............................................ H01L 33/00
(52) U.S. Cl. ........................................ 438/103; 257/94
(58) Field of Search .................................. 257/103, 94

(56) References Cited

U.S. PATENT DOCUMENTS

| | | | |
|---|---|---|---|
| 5,290,393 A | | 3/1994 | Nakamura |
| 5,880,498 A | * | 3/1999 | Kinoshita |
| 6,057,560 A | * | 5/2000 | Uchida |
| 6,232,623 B1 | * | 5/2001 | Morita |

FOREIGN PATENT DOCUMENTS

| | | |
|---|---|---|
| JP | 62-136035 A | 6/1987 |
| JP | 63-178516 A | 7/1988 |
| JP | 4-297023 | 10/1992 |
| JP | 06-177423 A | 6/1994 |
| JP | 7-312350 A | 11/1995 |

OTHER PUBLICATIONS

H. Inokawa et al., Observation of Initial Stage of Al Epitaxial Growth on Si (III) by Ionized Cluster Beam Deposition, Japanesse Journal of Applied Physicis, vol. 24, No. 3, pp. L173–L174, Mar. 1985.

I. Yamada et al., Epitaxial Growth of AL on Si (III) and Si (100) by Ionized–Cluster Beam, J. Appl. Phys., 56(10), pp. 2746–2750, Nov. 15, 1984.

I. Yamada; Thin–Film Designing with Ion Beams, the book edited by Japan Surfaces Science Association and published by Kyoritsu Shuppan, Section 5.5, pp. 90–95, 1991 (concise explanation in English).

S. Yokoyama et al., Influence of Sputerring Geometry on Crystallinity of Al (100) Thin Films on Offset (100) Si, Jpn. J. Appl. Phys., vol. 32, Part2, No. 2B, pp. L283–L286, Feb. 3, 1993.

H. Amano et al., Metalorganic Vapor Phase Epitaxial Growth of a High Quality GaN Film Using an A1N Buffer Layer, Appl. Phys. Lett. 48(5), pp. 353–355, Feb. 3, 1986.

* cited by examiner

Primary Examiner—Stephen D. Meler
(74) Attorney, Agent, or Firm—Eric J. Robinson; Nixon Peabody LLP

(57) ABSTRACT

A method for growing nitride semiconductor crystals according to the present invention includes the steps of: a) forming a first metal single crystal layer on a substrate; b) forming a metal nitride single crystal layer by nitrifying the first metal single crystal layer; and c) epitaxially growing a first nitride semiconductor layer on the metal nitride single crystal layer.

11 Claims, 14 Drawing Sheets

METHOD FOR GROWING NITRIDE SEMICONDUCTOR CRYSTALS, NITRIDE SEMICONDUCTOR DEVICE, AND METHOD FOR FABRICATING THE SAME

This application is a Divisional of application Ser. No. 09/317,604, now U.S. Pat. No. 6,218,207 filed May 25, 1999.

BACKGROUND OF THE INVENTION

The present invention relates to a method for growing nitride semiconductor crystals, a nitride semiconductor device and a method for fabricating the same.

Nitride semiconductors such as GaN, InN and AlN are materials suitably used for blue-light-emitting semiconductor laser devices and numerous types of semiconductor devices, e.g., transistors operating at a high speed at an elevated temperature.

Various methods have been suggested to form a single crystal layer of a nitride semiconductor suitable for these semiconductor devices.

For example, according to a conventional technique, a nitride semiconductor layer (e.g., an AlN layer) is directly deposited on a single crystal substrate of sapphire ($Al_2O_3$) or Si by a metalorganic vapor phase epitaxy (abbreviated to "MOVPE" and also called a "metalorganic chemical vapor deposition (MOCVD)") process. The nitride semiconductor layer formed by this method, however, has poor surface morphology and is likely to crack, resulting in a lower yield. Thus, this method has not been put into practice. Cracking is probably caused due to a thermal stress resulting from a difference in thermal expansion coefficient between a single crystal substrate and a nitride semiconductor layer during the process of lowering the deposition temperature of the nitride semiconductor layer (about 1000° C. for AlN) to room temperature.

Another technique of forming a single crystalline nitride semiconductor layer was developed later as disclosed in Japanese Laid-Open Publications Nos. 4-297023 and 7-312350. According to this technique, an amorphous or polycrystalline nitride semiconductor layer (i.e., a GaN or $Ga_{1-a}Al_aN$ (where $0<a\leq1$) layer) is once formed on a single crystal substrate of sapphire or silicon at a relatively low temperature by an MOVPE process. Thereafter, the nitride semiconductor layer is heated to form a partially single crystalline buffer layer and then nitride semiconductor layers for a semiconductor device are epitaxially grown on the buffer layer.

A light-emitting device disclosed in Japanese Laid-Open Publication No. 6-177423 is known as an exemplary semiconductor device using a nitride semiconductor layer formed on a buffer layer. As shown in FIG. 14, this light-emitting device 900 includes: a buffer layer 95 of polycrystalline or amorphous GaN or $Ga_{1-a}Al_aN$ (where $0<a\leq1$); an n-type $Ga_{1-b}Al_bN$ (where $0\leq b<1$) cladding layer 96; an n-type $In_xGa_{1-x}N$ (where $0<x<0.5$) active layer 97; and a p-type $Ga_{1-c}Al_cN$ (where $0\leq c<1$) cladding layer 98, which are stacked in this order on a sapphire substrate 92.

The crystal growing technique for the buffer layer 95 is also disclosed in Japanese Laid-Open Publications Nos. 4-297023 and 7-312350 identified above. Specifically, according to the method disclosed in these references, GaN or $Ga_{1-a}Al_aN$ (where $0<a\leq1$) crystals are grown at a temperature ranging from 200° C. to 900° C., both inclusive, by an MOVPE process to form the buffer layer 95. In accordance with this method, part of the buffer layer 95 is turned into single crystals during a process of raising the temperature after the buffer layer 95 of polycrystalline $Ga_{1-a}Al_aN$ (where $0<a\leq1$) has been deposited on the sapphire substrate 92 at a low temperature and before a nitride semiconductor crystal layer, e.g., the n-type $Ga_{1-b}Al_bN$ (where $0\leq b<1$) cladding layer 96, is deposited at a temperature of about 1000° C.

The present inventors minutely analyzed the cross-section of nitride semiconductor crystals, which had been grown on a sapphire substrate at a low temperature by the conventional technique, using a transmission electron microscope. As a result, we found that the nitride semiconductor crystal layer, which had been formed by the prior art crystal growing technique, had a lot of dislocations and that the lifetime of a semiconductor device including such a nitride semiconductor layer was short.

In the conventional method for fabricating a semiconductor device, it seems to be only a small region of the buffer layer 95 within a plane of the sapphire substrate 92 that is turned into single crystals during the temperature raising process before the nitride semiconductor crystal layers are grown. Thus, it is considered that, in the remaining region of the buffer layer 95 that is not turned into single crystals, the polycrystals have poorly aligned orientations to generate a large number of dislocations (or other defects) in the interface between the sapphire substrate 92 and the buffer layer 95. And such dislocations would grow to reach the nitride semiconductor crystal layers (i.e., the cladding layer 96, active layer 97 and cladding layer 98 in this case). We found that the density of dislocations in the nitride semiconductor crystal layers was as high as $10^9$ cm$^{-2}$, thus adversely shortening the life of the semiconductor device.

Still another technique of forming an AlN buffer layer by nitrifying (in this specification, to "nitrify" means "to combine with nitrogen or its compounds") the surface of a sapphire single crystal substrate was suggested in Japanese Laid-Open Publication No. 63-178516, for example. In accordance with this technique, however, the buffer layer is also likely to crack or a lot of dislocations are also created in the buffer layer as in the prior art method just described. Thus, this technique has not been put into practice, either.

SUMMARY OF THE INVENTION

An object of the present invention is providing a method for growing nitride semiconductor crystals with the number of dislocations created in a nitride semiconductor crystal layer reduced, a highly reliable semiconductor device with a longer lifetime, and a method for fabricating the same.

A method for growing nitride semiconductor crystals according to the present invention includes the steps of: a) forming a first metal single crystal layer on a substrate; b) forming a metal nitride single crystal layer by nitrifying the first metal single crystal layer; and c) epitaxially growing a first nitride semiconductor layer on the metal nitride single crystal layer.

The present invention also provides a method for fabricating a nitride semiconductor device including a semiconductor multilayer structure and a pair of electrodes for applying a voltage to the semiconductor multilayer structure. In this method, the step of forming the semiconductor multilayer structure includes the step of epitaxially growing the first nitride semiconductor layer by the method of the present invention for growing nitride semiconductor crystals.

A nitride semiconductor device according to the present invention includes: a single crystal substrate; a metal nitride single crystal layer formed by nitrifying a metal single crystal layer on the single crystal substrate; a semiconductor multilayer structure including a first nitride semiconductor layer epitaxially grown on the metal nitride single crystal layer; and a pair of electrodes for applying a voltage to the semiconductor multilayer structure.

Another nitride semiconductor device according to the present invention includes: a single crystal substrate with conductivity; a metal nitride single crystal layer formed by nitrifying a metal single crystal layer on the single crystal substrate; a semiconductor multilayer structure including a first nitride semiconductor layer epitaxially grown on the metal nitride single crystal layer; and a pair of electrodes formed to face each other on respective surfaces of the single crystal substrate and the semiconductor multilayer structure, which are interposed between the surfaces.

DESCRIPTION OF THE PREFERRED EMBODIMENTS

Figure 1A:
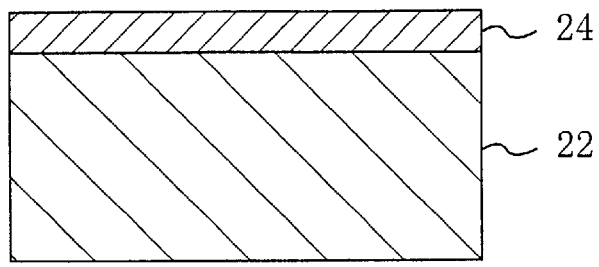
FIGS. 1A, 1B and 1C are cross-sectional views illustrating a method for growing nitride semiconductor crystals according to an exemplary embodiment of the present invention.

In a method for growing nitride semiconductor crystals according to the present invention, first, a metal single crystal layer is formed on a substrate, and then a metal nitride single crystal layer is formed by nitrifying the metal single crystal layer. Thereafter, nitride semiconductor layers are epitaxially grown on the resulting metal nitride single crystal layer. In the nitrification process step, the metal single crystal layer need not be nitrified entirely. Alternatively, only part of the metal single crystal layer may be nitrified and then nitride semiconductor layers may be epitaxially grown on a metal nitride single crystal layer formed around the surface of the metal single crystal layer. As a further alternative, another metal single crystal layer, different from the metal single crystal layer to be nitrified, may be formed on the substrate and then the metal single crystal layer to be nitrified may be formed thereon.

The metal nitride single crystal layer, on which nitride semiconductor layers are to be epitaxially grown, functions as a conventional buffer layer, thus improving the crystallinity of the nitride semiconductor layers. Such a buffer layer, made of a metal nitride formed by nitrifying the metal single crystals, is a single crystal layer with a much smaller number of defects than a polycrystalline layer or layer formed by turning part of a polycrystalline layer into single crystals in the prior art. Accordingly, nitride semiconductor layers with a low density of dislocations may be deposited thereon by an epitaxy process.

In addition, compared to a conventional crystal-growing technique, the creation of cracks in the metal nitride single crystal layer or the nitride semiconductor layers formed thereon can be suppressed or virtually prevented. The creation of cracks can be suppressed probably by the following mechanism. Firstly, in accordance with the thermal hysteresis during the process steps of forming the metal single crystal layer and nitrifying the metal single crystal layer, thermal stress, which is caused between the metal nitride single crystal layer and the substrate or the metal single crystal layer can be reduced. Secondly, since the interfacial state between the metal single crystal layer or the metal nitride single crystal layer and the substrate is different from that resulting from the conventional technique, the stress can be relaxed, or the generation of the stress can be suppressed.

The metal single crystal layer may be formed by a known technique. For example, the metal single crystal layer may be epitaxially grown on a single crystal substrate by an ionized cluster beam (ICB) process or a sputtering technique. Methods for growing a metal single crystal layer by an ICB process, ICB apparatuses and growth conditions are disclosed, for example, by H. Inokawa et al., Jpn. J. Appl. Phys. 24 (1985), pp. L173–L174, I. Yamada et al., J. Appl. Phys. 56 (1986), pp. 2746–2750 and K. Yamada, edited by Japan Surface Science Association, "Thin-film Designing with Ion beams", Section 5.5, pp. 90–95, Kyoritsu Shuppan, 1991. A method for growing a metal single crystal layer by a sputtering technique is described, for example, by S. Yokoyama et al., Jpn. J. Appl. Phys. 32 (1993), pp. L283–L286. According to the ICB process, in particular, a metal single crystal layer of excellent quality can be formed (the interfacial state between the metal single crystal layer and the single crystal substrate would also be good). In addition, in accordance with the ICB process, a metal single crystal layer can be epitaxially grown on a single crystal substrate with a relatively large lattice mismatch (e.g., about 25% or more). The documents cited above are hereby incorporated by reference as those disclosing a method for epitaxially growing a metal single crystal layer, which is applicable to the embodiments of the present invention.

According to a method for epitaxially growing a metal single crystal layer on a single crystal substrate, various types of single crystal substrates may be used. The single crystal substrate may either be a dielectric (insulator) or have electrical conductivity (semiconductor or conductor). If a conductive substrate is used, then the structure of the semiconductor device can be advantageously simplified. This point will be detailed in describing embodiments of a method for fabricating a semiconductor device.

If a nitride semiconductor device is fabricated in accordance with the method for growing nitride semiconductor crystals according to the present invention, the creation of cracks in a nitride semiconductor layer can be suppressed and the density of defects in the layer can be reduced. Accordingly, a highly reliable nitride semiconductor device with a long lifetime can be fabricated.

Hereinafter, a method for growing nitride semiconductor crystals according to an exemplary embodiment of the present invention will be described with reference to FIGS. 1A through 6. In all the drawings referred to in the following description, components with similar basic functions will be identified by the same reference numeral for the sake of simplicity FIGS. 1A, 1B and 1C are cross-sectional views illustrating respective process steps for growing nitride semiconductor crystals in an exemplary embodiment of the present invention.

First, as shown in FIG. 1A, a metal single crystal layer 24 is formed on a substrate 22. For example, a single crystal substrate is used as the substrate 22 and the metal single crystal layer 24 is epitaxially grown on the single crystal substrate 22 by an ICB process, which may be carried out as disclosed in the documents cited above. For instance, the ICB process may be performed at room temperature within an ambient at a pressure of about $1\times10^{-9}$ Torr (i.e., about $1.4\times10^{-7}$ Pa) or less. Before this epitaxial growth process step is performed, a process step of cleaning the surface of the single crystal substrate 22 may be carried out.

The single crystal substrate 22 may be made of: insulator single crystals of sapphire, spinel, magnesium oxide, zinc oxide, chromium oxide, lithium niobium oxide, lithium tantalum oxide or lithium gallium oxide; semiconductor single crystals represented by $Si_{1-s-t}Ge_sC_t$ (where $0 \leq s$, $t \leq 1$ and $0 \leq s+t \leq 1$) or $A_{1-u}B_u$ (where $0<u<1$, A is one of Al, Ga and In and B is one of As, P and Sb); or metal single crystals of hafnium, for example. The metal single crystal layer 24 to be epitaxially grown on the single crystal substrate 22 may be made of $Al_{1-x-y}Ga_xIn_y$ (where $0 \leq x$, $y \leq 1$ and $0 \leq x+y<1$).

Figure 1B:
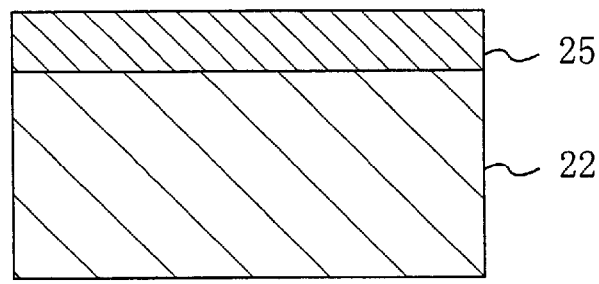
Figure 1C:
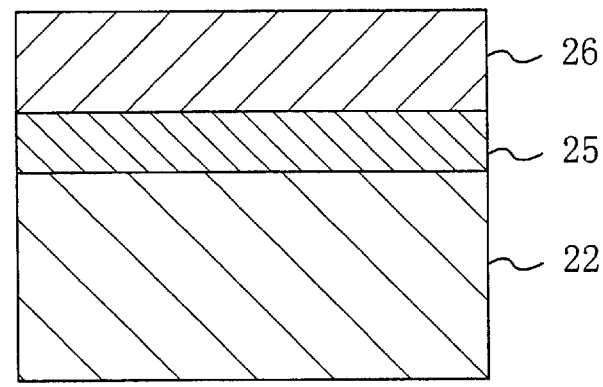

Next, as shown in FIG. 1B, the metal single crystal layer 24 is nitrified, thereby forming the metal nitride single crystal layer 25. This nitrification process step may be performed by heating the metal single crystal layer 24 within an ambient of a compound containing nitrogen. The compound containing nitrogen is preferably hydrazine ($N_2H_4$) or ammonium ($NH_3$). Hydrazine is particularly preferable, because hydrazine has higher nitrification ability than ammonium and can shorten the nitrification time or lower the nitrification temperature.

The nitrification temperature can be appropriately set depending on the necessity. However, the upper limit of the nitrification temperature is preferably lower than the melting point of the metal single crystal layer 24. This is because if the metal single crystal layer 24 is heated at a temperature equal to or higher than the melting point thereof for a long time, then the metal single crystal layer 24 melts and the crystal structure thereof collapses. In such a situation, the metal nitride layer, formed by the nitrification, is sometimes a non-single crystal layer or a crystal layer with a large number of dislocations. Accordingly, in order to form a metal nitride single crystal layer of good quality, the metal single crystal layer is preferably nitrified at a temperature lower than the melting point of the metal single crystal layer by about 100° C. or more. The nitrification temperature has no particular lower limit. However, since the nitrification reaction of a metal is an Arrhenius-type reaction, the higher the nitrification temperature, the shorter the time taken to nitrify the metal single crystal layer. For example, in nitrifying a metal single crystal layer of $Al_{1-x-y}Ga_xIn_y$, the nitrification temperature is preferably about 200° C. or more within the hydrazine ambient or about 400° C. or more within the ammonium ambient. If the nitrification temperature is set at such a value, a metal single crystal layer with a thickness of several tens nanometers can be nitrified within several tens minutes. Since the metal nitride single crystal layer 25, which is formed by nitrifying the metal single crystal layer 24, is thicker than the original metal single crystal layer 24, the thickness of the layer 25 is emphasized in FIG. 1B.

Then, a nitride semiconductor layer 26 is epitaxially grown on the resulting metal nitride layer 25 by a known technique. For example, a layer made of a nitride represented as $Al_{1-s-t}Ga_sIn_tN$ (where $0 \leq s$, $t \leq 1$ and $0 \leq s+t \leq 1$) may be epitaxially grown as the nitride semiconductor layer 26. Naturally, the composition of the nitride semiconductor layer 26 may be different from that of the metal nitride layer 25. Since the metal nitride single crystal layer 25 has a small number of dislocations, the nitride semiconductor layer 26, which is epitaxially grown thereon, is also a single crystal layer with a small number of dislocations. In addition, compared to a conventional crystal-growing technique, the creation of cracks in the metal nitride single crystal layer 25 or the nitride semiconductor layer 26 formed thereon can be suppressed or virtually prevented. For example, according to the conventional crystal-growing technique, if a GaN layer is epitaxially grown on an AlN buffer layer deposited on an Si single crystal substrate at a high temperature (e.g., about 1000° C.), a distance between cracks, which are generated in the AlN buffer layer and the GaN layer, is about 20 $\mu$m on average. On the other hand, if the GaN layer is epitaxially grown on an AlN layer obtained by nitrifying an Al metal single crystal layer, a distance between cracks is about 2 mm to 30 mm on average. An average distance between cracks, which are generated in the nitride semiconductor layer formed according to the crystal-growing method of the present invention, is about 10 mm or more. Therefore, according to the crystal-growing method of the present invention, semiconductor devices can be fabricated with a good yield.

Figure 2A:
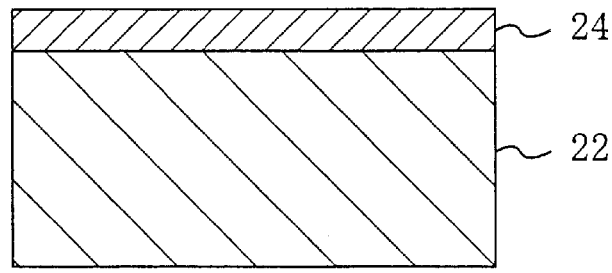
FIGS. 2A, 2B and 2C are cross-sectional views illustrating a method for growing nitride semiconductor crystals according to another embodiment of the present invention.
Figure 2B:
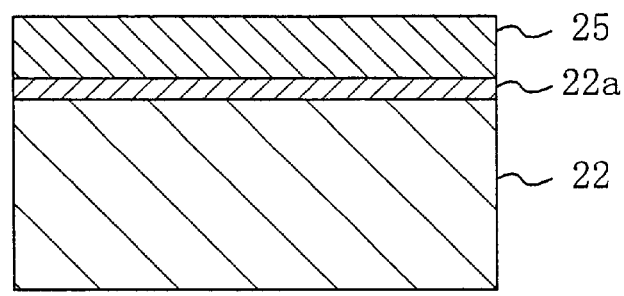
Figure 2C:
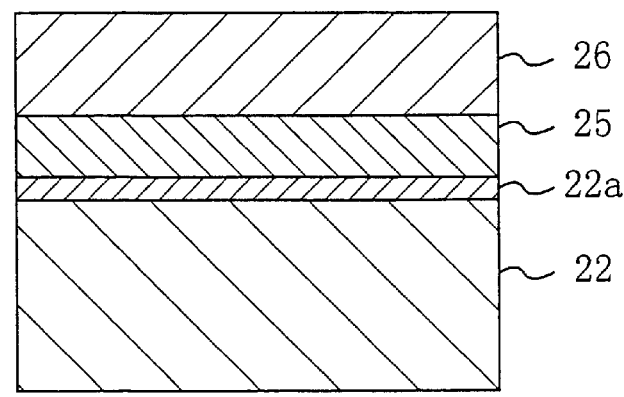

Another exemplary embodiment of a method for growing nitride semiconductor crystals is illustrated in FIGS. 2A, 2B and 2C. This embodiment is different from the embodiment shown in FIGS. 1A, 1B and 1C in the nitrification process step shown in FIG. 2B. Specifically, in the step shown in FIG. 2B, the metal single crystal layer 24 is nitrified and metal atoms diffuse from the metal single crystal layer 24 into the substrate 22 to form a metal diffused layer 22a within the surface of the substrate 22 (i.e., the interface between the metal nitride single crystal layer 25 and the substrate 22).

The probability of diffusion of the metal atoms is dependent on the combination of materials for the single crystal substrate 22 and the metal single crystal layer 24. For example, if the single crystal substrate 22 is made of silicon or a semiconductor represented as $A_{1-u}B_u$ (where $0<u<1$, A is one of Al, Ga and In and B is one of As, P and Sb) and the metal single crystal layer 24 is made of Al or an alloy containing Al, more specifically, $Al_{1-x-y}Ga_xIn_y$, then Al atoms are likely to diffuse into the substrate 22 to form the metal diffused layer 22a easily. For example, if Al is used to form the metal single crystal layer 24 and the resultant Al single crystal layer is nitrified at about 550° C. for about an hour, then a metal diffused layer 22a with a thickness of about 1 nm is obtained.

It is considered that this metal diffused layer 22a improves the adhesion between the substrate 22 and the metal nitride single crystal layer 25 and relaxes a stress resulting from a difference in thermal expansion coefficient therebetween. In addition, the metal diffused layer 22a can also reduce the thermal contact resistance between the substrate 22 and the multilayer structure formed thereon. Furthermore, when the single crystal substrate 22 and the metal nitride single crystal layer 25 both have conductivity, the metal diffused layer 22a can constitute an ohmic contact therebetween.

Figure 3A:
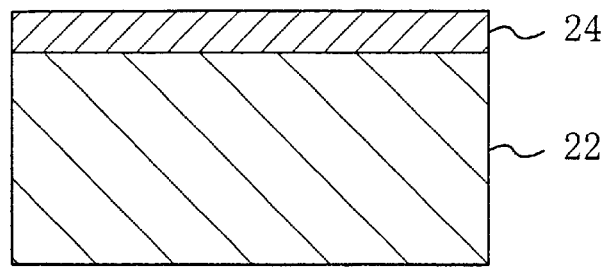
FIGS. 3A, 3B and 3C are cross-sectional views illustrating a method for growing nitride semiconductor crystals according to still another embodiment of the present invention.
Figure 3B:
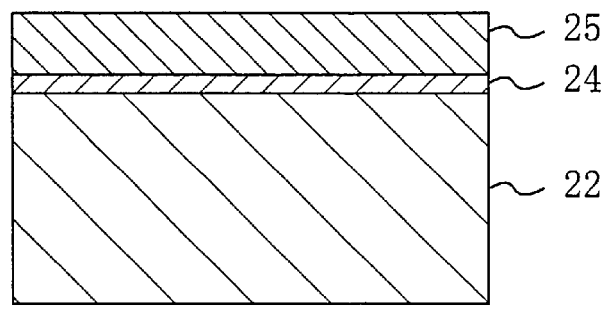
Figure 3C:
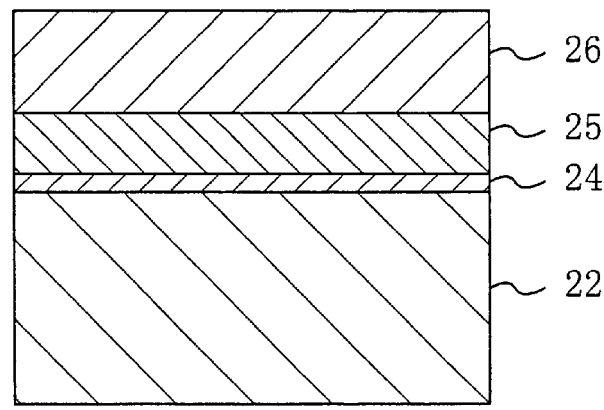

Still another exemplary embodiment of a method for growing nitride semiconductor crystals is illustrated in FIGS. 3A, 3B and 3C. This embodiment is different from the embodiment shown in FIGS. 1A, 1B and 1C in the nitrification process step shown in FIG. 3B. Specifically, in the step shown in FIG. 3B, only a part of the metal single crystal layer 24 is nitrified to form the metal nitride single crystal layer 25. The thickness of that part of the metal single crystal layer 24 to be nitrified can be controlled by adjusting the nitrification time, for example.

By partially leaving the metal single crystals 24 between the single crystal substrate 22 and the metal nitride single crystal layer 25 without completely nitrifying the metal single crystal layer 24, the thermal contact resistance between the substrate 22 and the multilayer structure formed thereon can be reduced. In addition, a stress created between the single crystal substrate 22 and the metal nitride single crystal layer 25 can be relaxed by the metal single crystal layer 24. This is probably because the elastic modulus of a metal is generally lower than that of a nitride of the metal.

Figure 4A:
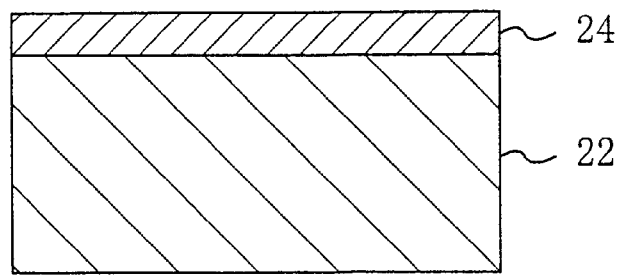
FIGS. 4A, 4B and 4C are cross-sectional views illustrating a method for growing nitride semiconductor crystals according to yet another embodiment of the present invention.
Figure 4B:
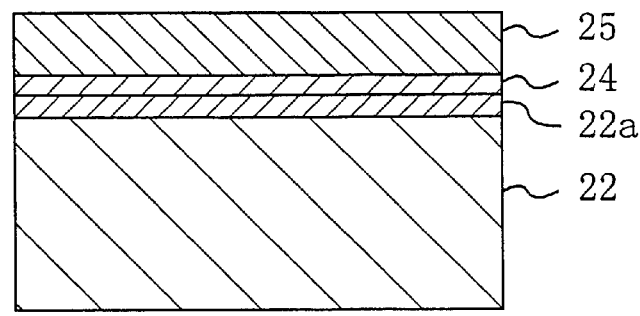
Figure 4C:
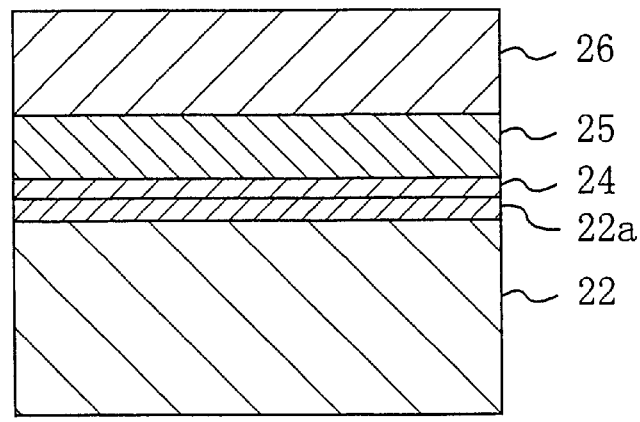

Yet another exemplary embodiment of a method for growing nitride semiconductor crystals is illustrated in FIGS. 4A, 4B and 4C. This embodiment is different from the embodiment shown in FIGS. 1A, 1B and 1C in the nitrification process step shown in FIG. 4B. Specifically, in the step shown in FIG. 4B, only a part of the metal single crystal layer 24 is nitrified to form the metal nitride single crystal layer 25, and metal atoms diffuse from the metal single crystal layer 24 into the substrate 22 to form a metal diffused layer 22a within the surface of the substrate 22 (i.e., the interface between the metal single crystal layer 24 and the substrate 22). As already described for the embodiment shown in FIGS. 2A, 2B and 2C, the metal diffused layer 22a is formed sometimes easily but sometimes not, dependent on the combination of materials for the single crystal substrate 22 and the metal single crystal layer 24. By using the above-exemplified combination of materials and controlling the thickness of that part of the metal single crystal layer 24 to be nitrified, the structure shown in FIG. 4B can be obtained. As already described for the embodiment shown in FIGS. 3A, 3B and 3C, the thickness of that part of the metal single crystal layer 24 to be nitrified can be controlled by adjusting the nitrification time, for example.

Figure 5A:
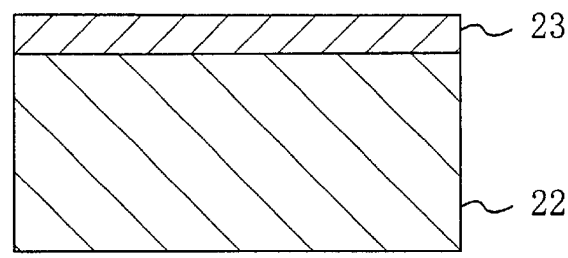
FIGS. 5A, 5B, 5C and 5D are cross-sectional views illustrating a method for growing nitride semiconductor crystals according to yet another embodiment of the present invention.
Figure 5B:
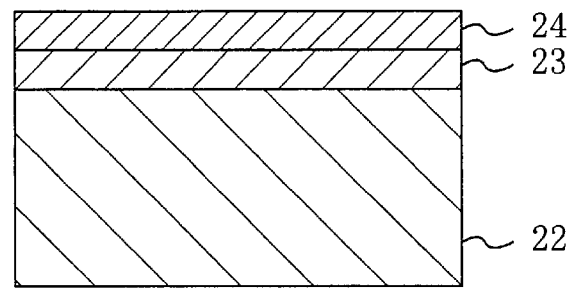
Figure 5C:
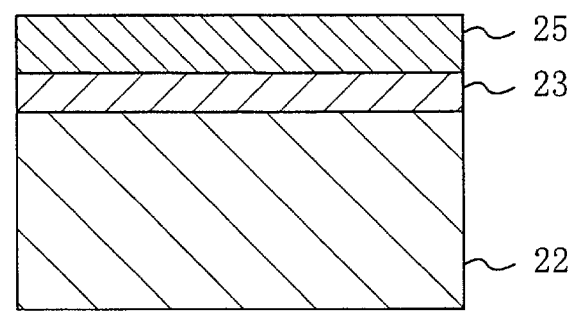
Figure 5D:
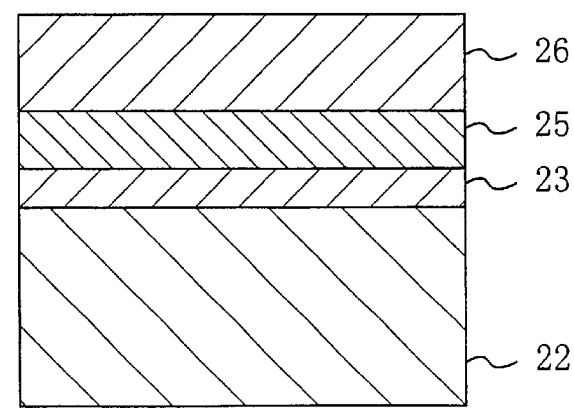

Yet another exemplary embodiment of a method for growing nitride semiconductor crystals is illustrated in FIGS. 5A, 5B, 5C and 5D. This embodiment is different from the foregoing embodiments in that an additional metal single crystal layer 23 is formed before the metal single crystal layer 24 to be nitrified is formed over the substrate 22 as shown in FIG. 5A.

The metal single crystal layer 23, as well as the metal single crystal layer 24 of the foregoing embodiments, may be formed by a known technique. For example, a single crystal substrate is prepared as the substrate 22 and the metal single crystal layer 23 is epitaxially grown thereon by an ICB process, for example. A metal material for the metal single crystal layer 23 is preferably Au or an alloy containing Au (e.g., an alloy of Au and Ge). By forming this additional metal single crystal layer 23, the thermal contact resistance between the substrate 22 and the multilayer structure formed thereon can be reduced.

If the single crystal substrate 22 is made of a semiconductor represented as $Si_{1-s-t}Ge_sC_t$ (where $0 \leq s$, $t \leq 1$ and $0 \leq s+t \leq 1$) or $Al_{1-u}B_u$ (where $0<u<1$, A is one of Al, Ga and In and B is one of As, P and Sb) where the metal single crystal layer 23 is made of Au or an alloy containing Au, then metal atoms constituting the metal single crystal layer 23 diffuse into the single crystal substrate 22 to form a metal diffused layer therein during the process step of nitrifying the metal single crystal layer 24. As a result, not only thermal contact resistance but also electrical contact resistance can be reduced between the single crystal substrate 22 and the semiconductor multilayer structure formed thereon. In this case, part of the atoms constituting the metal single crystal layer 23 may be diffused. Alternatively, as shown in FIGS. 6A, 6B, 6C and 6D, a metal diffused layer 22a may be formed by diffusing all the atoms constituting the metal single crystal layer 23 into the single crystal substrate 22 during the step of forming the metal nitride single crystal layer 25 through the nitrification of the metal single crystal layer 24. According to this method, the metal single crystal layer 23 disappears (see FIG. 6C). In order to eliminate the metal single crystal layer 23 through diffusion, the thickness of the metal single crystal layer 23 is preferably about 3 nm or less. Also, the temperature and time for the process step of nitrifying the metal single crystal layer 24 may be set based on the degree of diffusion of the metal single crystal layer 23. For example, if atoms in the metal single crystal layer 23 should be continuously diffused after the nitrification reaction of the metal single crystal layer 24 is over, heating may be continued.

This embodiment may be combined with any of the foregoing embodiments. For example, if the metal single crystal layer 23 is made of Au or an alloy containing Au and the single crystal substrate 22 is made of a semiconductor represented as $Si_{1-s-t}Ge_sC_t$ or $A_{1-u}B_u$, then metal atoms diffuse from the metal single crystal layer 23 into the single crystal substrate 22 to form the metal diffused layer 22a as in the embodiment shown in FIG. 2B. In this case, if the metal single crystal layer 23 is sufficiently thin (e.g., about 3 nm or less), then all the metal atoms constituting the metal single crystal layer 23 diffuse into the single crystal substrate 22 and substantially no metal single crystal layer 23 is left. In this structure, the AlN single crystal layer 25 with satisfactorily aligned crystal orientations is formed on the sapphire substrate 22. Accordingly, the density of defects or dislocations can be reduced both in the interface between the sapphire substrate 22 and the AlN single crystal layer 25 and in the n-type $Ga_{0.9}Al_{0.1}N$ cladding layer 26, MQW active layer 27, p-type $Ga_{0.9}Al_{0.1}N$ cladding layer 28 and p-type GaN contact layer 29, which are stacked thereon. In this structure, increase in resistance due to a Schottky barrier generated by a semiconductor/metal interface can be prevented, since there is no semiconductor/metal interface.

Also, after the metal single crystal layers 23 and 24 have been formed, only a part of the metal single crystal layer 24 may be nitrified as described for the embodiment shown in FIG. 3B. Furthermore, after the metal single crystal layers 23 and 24 have been formed, the metal diffused layer 22a may be formed and only a part of the metal single crystal layer 24 may be nitrified to leave the metal single crystal layer 24 between the metal nitride single crystal layer 25 and the metal single crystal layer 23 as described for the embodiment shown in FIG. 4B. In any combination, the effects of the embodiment shown in FIG. 2B, 3B or 4B can be additionally attained.

Since a nitride semiconductor layer having (0001) principal surface is generally used in a semiconductor device, it is preferable to form a metal nitride layer having (0001) principal surface so that a nitride semiconductor layer having (0001) principal surface can be epitaxially grown on the metal nitride layer. More specifically, when a single crystal substrate, made of semiconductor single crystals represented by $Si_{1-s-t}Ge_sC_t$ (where $0 \leq s$, $t \leq 1$ and $0 \leq s+t \leq 1$) or $A_{1-u}B_u$ (where $0<u<1$, A is one of Al, Ga and In and B is one of As, P and Sb), is used, an $Al_{1-x-y}Ga_xIn_yN$ (where $0 \leq x$, $y \leq 1$ and $0 \leq x+y<1$) single crystal layer having (0001) principal surface can be obtained by nitrifying an $Al_{1-x-y}Ga_xIn_y$ layer having (111) principal surface epitaxially grown on (111) plane of the single crystal substrate made of $Si_{1-s-t}Ge_sC_t$ or $A_{1-u}B_u$.

Hereinafter, specific embodiments of fabricating a semiconductor device in accordance with the foregoing method for growing nitride semiconductor crystals will be described. In the following illustrative embodiments, a light-emitting device (i.e., a semiconductor laser diode) is fabricated as an exemplary semiconductor device. However, the present invention is not limited to those specific embodiments, but is applicable to various other semiconductor devices like a field effect transistor (FET).

EMBODIMENT 1

In a first exemplary embodiment of the present invention, a light-emitting device 100 is formed using a substrate with no conductivity.

Specific Example 1-1

Figure 7:
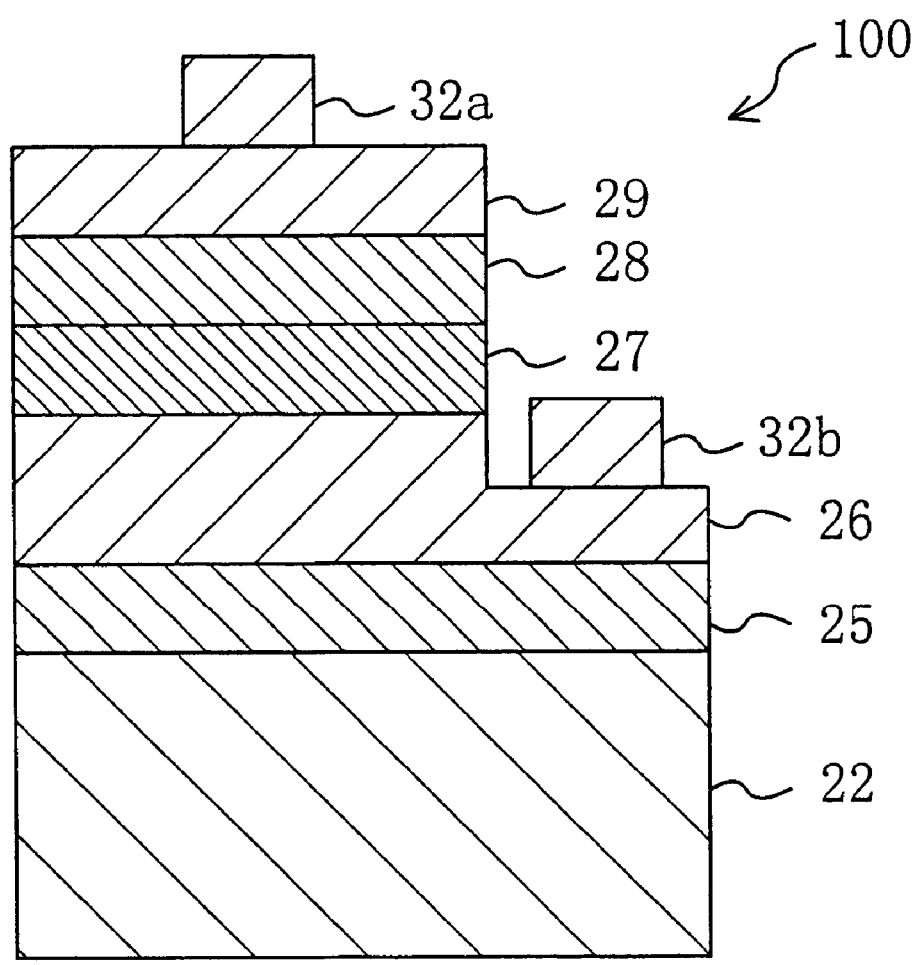
FIG. 7 is a cross-sectional view schematically illustrating a light-emitting device 100 in a first specific example of a first embodiment according to the present invention.

As shown in FIG. 7, the light-emitting device 100 includes: an AlN single crystal layer 25 (thickness: 10 nm); an n-type $Ga_{0.9}Al_{0.1}N$ cladding layer 26 (thickness: 1 μm); a multiple quantum well (MQW) active layer 27; a p-type $Ga_{0.9}Al_{0.1}N$ cladding layer 28 (thickness: 0.5 μm); and a p-type GaN contact layer 29 (thickness: 0.1 μm), which are stacked in this order on a sapphire substrate 22. The MQW active layer 27 is formed by alternately stacking ten pairs of undoped $In_{0.2}Ga_{0.8}N$ layers (thickness: 5 nm) and undoped GaN layers (thickness: 5 nm). Of these layers, the lowermost undoped GaN layer is in contact with the n-type $Ga_{0.9}Al_{0.1}N$ cladding layer 26.

This semiconductor multilayer structure, including the cladding layer 26, active layer 27, cladding layer 28 and contact layer 29, which are formed on the AlN single crystal layer 25 has been subjected to a mesa-etching process. Through this etching process, a pair of electrodes 32a and 32b for applying a voltage to the semiconductor multilayer structure are formed on the contact layer 29 and on the cladding layer 26, respectively.

In this structure, the AlN single crystal layer 25 with satisfactorily aligned crystal orientations is formed on the sapphire substrate 22. Accordingly, the density of defects or dislocations can be reduced both in the interface between the sapphire substrate 22 and the AlN single crystal layer 25 and in the n-type $Ga_{0.9}Al_{0.1}N$ cladding layer 26, MQW active layer 27, p-type $Ga_{0.9}Al_{0.1}N$ cladding layer 28 and p-type GaN contact layer 29, which are stacked thereon.

The light-emitting device 100 may be fabricated in accordance with the crystal-growing method shown in FIGS. 1A through 1C. A method for fabricating this light-emitting device 100 will be described with reference to FIGS. 8A, 8B and 8C.

Figure 8A:
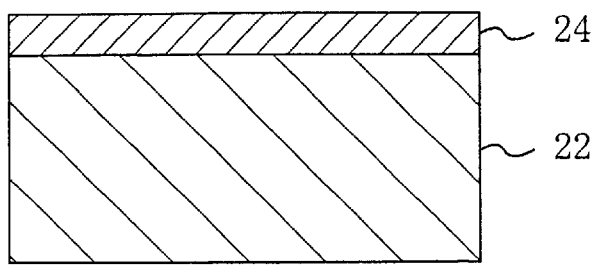
FIGS. 8A, 8B and 8C are cross-sectional views schematically illustrating a method for fabricating the light-emitting device 100 shown in FIG. 7.
Figure 8B:
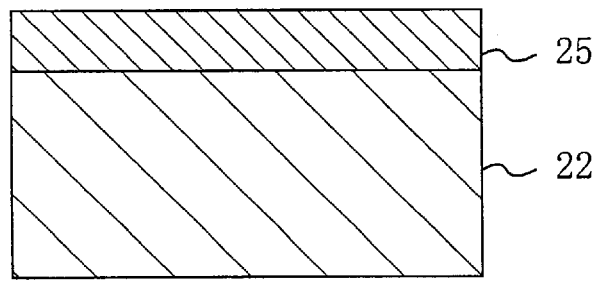

First, as shown in FIG. 8A, an Al single crystal layer 24 is deposited on a sapphire substrate 22 by an ICB process. Next, as shown in FIG. 8B, the Al single crystal layer 24 is nitrified to be an AlN single crystal layer 25. The nitrification may be performed by reacting nitrogen components, which are included in a nitrogen compound such as hydrazine or ammonium contained in an appropriate carrier gas (e.g., $H_2$ gas), with the Al single crystal layer 24 while the temperature of the sapphire substrate 22 is kept at 550° C., which is about 100° C. lower than the melting point of Al single crystals (i.e., 660° C.).

Figure 8C:
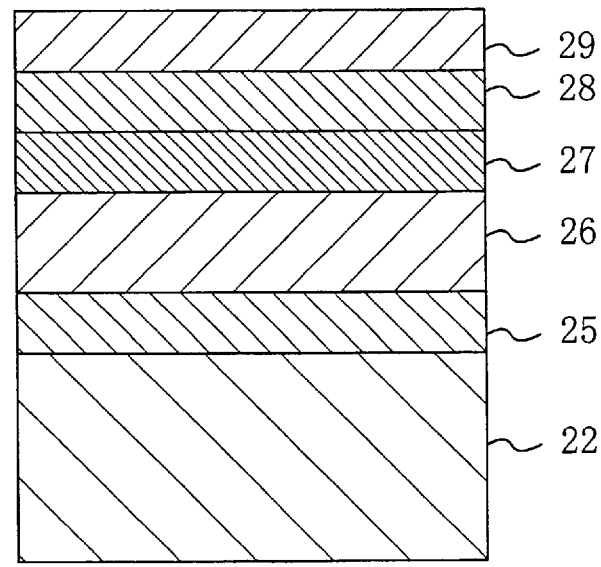

Thereafter, as shown in FIG. 8C, an n-type $Ga_{0.9}Al_{0.1}N$ cladding layer 26 doped with Si, an MQW active layer 27, a p-type $Ga_{0.9}Al_{0.1}N$ cladding layer 28 doped with Mg and a p-type GaN contact layer 29 doped with Mg are stacked in this order on the AlN single crystal layer 25 by an MOVPE process. In this process step, crystals for the n-type $Ga_{0.9}Al_{0.1}N$ cladding layer 26, p-type $Ga_{0.9}Al_{0.1}N$ cladding layer 28 and p-type GaN contact layer 29 are grown at 1000° C., while crystals for the MQW active layer 27 are grown at 800° C.

The resulting semiconductor multilayer structure, including the respective layers 26, 27, 28 and 29, is partially etched, thereby exposing the n-type $Ga_{0.9}Al_{0.1}N$ cladding layer 26. Finally, respective ohmic electrodes 32a and 32b are formed on the p-type GaN contact layer 29 and on the n-type $Ga_{0.9}Al_{0.1}N$ cladding layer 26 to complete the light-emitting device 100. The electrode 32a may be formed of, for example, Ni/Au, and the electrode 32b may be formed of, for example, Ti/Au by an electron beam deposition method.

In this structure, since the AlN single crystal layer 25 is formed by nitrifying the Al single crystal layer 24, the AlN single crystal layer 25 can be formed over the entire surface of the sapphire substrate 22. Accordingly, the crystallinity of the n-type $Ga_{0.9}Al_{0.1}N$ cladding layer 26, MQW active layer 27, p-type $Ga_{0.9}Al_{0.1}N$ cladding layer 28 and p-type GaN contact layer 29, which are stacked on the AlN single crystal layer 25, can be improved.

The cross section of the light-emitting device 100 according to the first specific example of the first embodiment was observed with a transmission electron microscope (TEM). As a result, the density of defects or dislocations in the n-type $Ga_{0.9}Al_{0.1}N$ cladding layer 26, MQW active layer 27, p-type $Ga_{0.9}Al_{0.1}N$ cladding layer 28 and GaN contact layer 29 was $1.0 \times 10^5/cm^2$, which is about 1/10,000 compared to a conventional light-emitting device.

Specific Example 1-2

A light-emitting device according to a second specific example of the first embodiment includes an $Al_{0.9}Ga_{0.1}N$ single crystal layer 25 (thickness: 5 nm), the n-type $Ga_{0.9}Al_{0.1}N$ cladding layer 26, MQW active layer 27, p-type $Ga_{0.9}Al_{0.1}N$ cladding layer 28 and p-type GaN contact layer 29, which are stacked in this order on an $MgAl_2O_4$ (spinel) substrate 22 as shown in FIG. 7.

In this structure, the $Al_{0.9}Ga_{0.1}N$ single crystal layer 25 with satisfactorily aligned crystal orientations is formed on the spinel substrate 22. Accordingly, the density of defects or dislocations can be reduced in both the interface between the spinel substrate 22 and the $Al_{0.9}Ga_{0.1}N$ single crystal layer 25, and the n-type $Ga_{0.9}Al_{0.1}N$ cladding layer 26, MQW active layer 27, p-type $Ga_{0.9}Al_{0.1}N$ cladding layer 28 and p-type GaN contact layer 29, which are stacked thereon.

A method for fabricating this light-emitting device 100 will be described with reference to FIGS. 8A, 8B and 8C again.

First, as shown in FIG. 8A, an $Al_{0.9}Ga_{0.1}$ alloy single crystal layer 24 is deposited to be 5 nm thick on a spinel substrate 22 by an ICB process. Next, as shown in FIG. 8B, the $Al_{0.9}Ga_{0.1}$ alloy single crystal layer 24 is nitrified to be an $Al_{0.9}Ga_{0.1}N$ single crystal layer 25. The nitrification may be performed by reacting nitrogen components, which are included in a nitrogen compound such as hydrazine or ammonium contained in an appropriate carrier gas (e.g., $H_2$ gas), with the $Al_{0.9}Ga_{0.1}$ alloy single crystal layer 24 while the temperature of the spinel substrate 22 is kept at 500° C.

Thereafter, as shown in FIG. 8C, n-type $Ga_{0.9}Al_{0.1}N$ cladding layer 26 doped with Si, MQW active layer 27, p-type $Ga_{0.9}Al_{0.1}N$ cladding layer 28 doped with Mg and p-type GaN contact layer 29 doped with Mg are stacked in this order on the $Al_{0.9}Ga_{0.1}N$ single crystal layer 25 as in the first specific example. The resulting semiconductor multilayer structure, including the respective layers 26, 27, 28 and 29, is partially etched, thereby exposing the n-type $Ga_{0.9}Al_{0.1}N$ cladding layer 26. Finally, respective ohmic electrodes 32a and 32b are formed on the p-type GaN contact layer 29 and on the n-type $Ga_{0.9}Al_{0.1}N$ cladding layer 26.

In this structure, since the $Al_{0.9}Ga_{0.1}N$ single crystal layer 25 is formed by nitrifying the $Al_{0.9}Ga_{0.1}$ alloy single crystal layer 24, the $Al_{0.9}Ga_{0.1}N$ single crystal layer 25 can be formed over the entire surface of the spinel substrate 22. Accordingly, the crystallinity of the n-type $Ga_{0.9}Al_{0.1}N$ cladding layer 26, MQW active layer 27, p-type $Ga_{0.9}Al_{0.1}N$ cladding layer 28 and p-type GaN contact layer 29, which are stacked on the $Al_{0.9}Ga_{0.1}N$ single crystal layer 25, can be improved.

The cross section of the light-emitting device 100 according to the second specific example of the first embodiment was observed with a TEM. As a result, the density of defects or dislocations in the n-type $Ga_{0.9}Al_{0.1}N$ cladding layer 26, MQW active layer 27, p-type $Ga_{0.9}Al_{0.1}N$ cladding layer 28 and GaN contact layer 29 was $1.0 \times 10^5/cm^2$, which is about 1/10,000 compared to a conventional light-emitting device.

Figure 9:
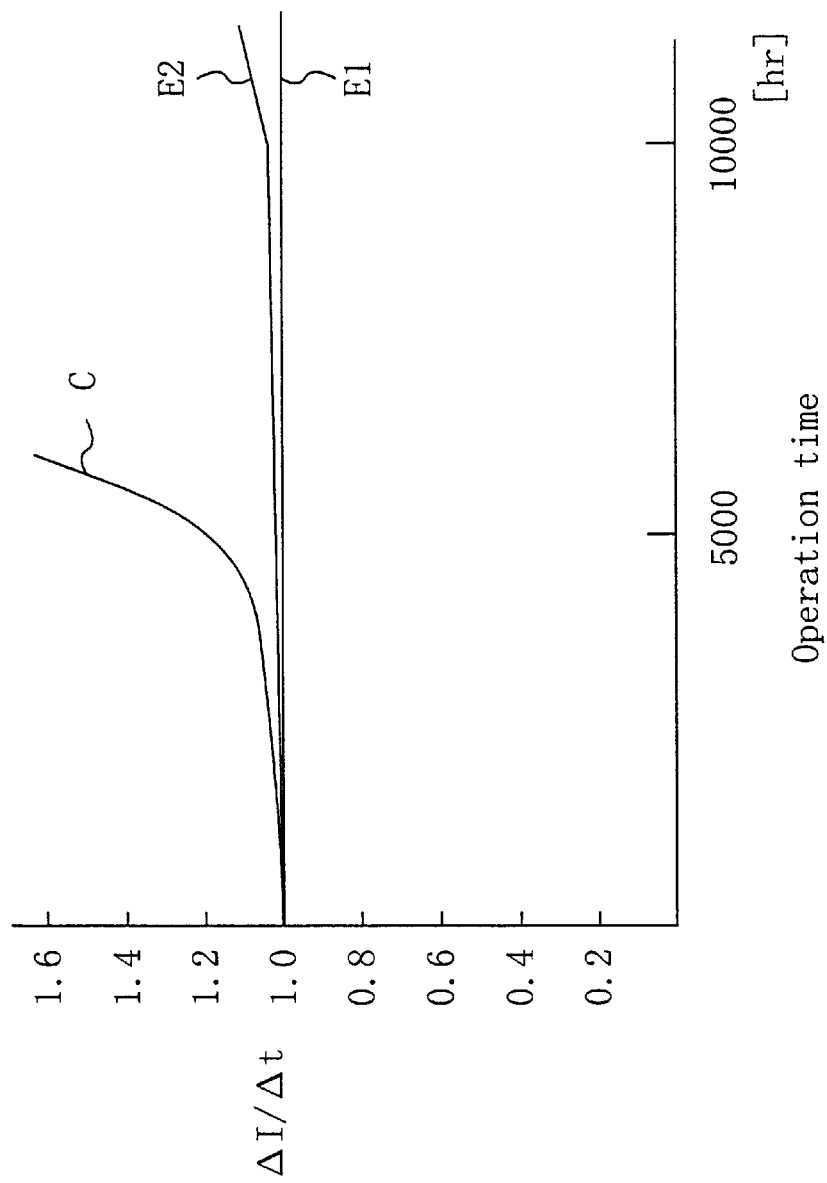
FIG. 9 is a graph illustrating respective relationships between operating time and variation in operating current for the light-emitting devices of the present invention and a conventional light-emitting device.

FIG. 9 illustrates respective lifetimes of the light-emitting devices 100 according to the first and second specific examples of the first embodiment (hereinafter, identified by E1 and E2, respectively) and a conventional light-emitting device C, which are all operated at a temperature of 70° C. with an optical output of 5 mW. In FIG. 9, the curves E1, E2 and C indicate respective relationships between the operating time and a variation in operating current per unit time of the light-emitting devices E1, E2 and C. In FIG. 9, as the variation $\Delta I/\Delta t$, which is a variation of the operating current with the operating time, comes closer to 1, a light-emitting device deteriorates to a lesser degree and can operate for a longer time. As shown in FIG. 9, in the light-emitting devices E1 and E2 of the present invention, $\Delta I/\Delta t$ is still close to 1 even after these devices have been operated for 10,000 hours. In contrast, after the conventional light-emitting device C has been operated for 5,000 hours, $\Delta I/\Delta t$ greatly deviates from 1. Accordingly, the light-emitting devices E1 and E2 of the present invention have much longer lifetimes, and are a lot more reliable, than the conventional light-emitting device C. It should be noted that the oscillation wavelengths of these light-emitting devices were all 420 nm.

In the foregoing specific examples, the same effects can be attained if the sapphire or spinel substrate 22 is replaced with a single crystal substrate of MgO, ZnO, $Cr_2O_3$, $LiNbO_3$, $LiTaO_3$ or $LiGaO_2$.

As described above, the first embodiment of the present invention provides a semiconductor device with reduced defects or dislocations in the interface between an insulating single crystal substrate and a nitride semiconductor crystal layer, a longer lifetime and higher reliability and a method for fabricating the same.

In the foregoing illustrative embodiment, a method for fabricating a light-emitting device in accordance with the nitride semiconductor crystal-growing method shown in FIGS. 1A through 1C has been described. Alternatively, any of the other crystal-growing methods shown in FIGS. 2A through 6D is also applicable. According to any of these methods, the same effects as those of the first embodiment can be attained.

EMBODIMENT 2

In a second exemplary embodiment of the present invention, a light-emitting device 200 is formed using a substrate with conductivity, which includes a semiconductor substrate and a conductor substrate made of a metal, for example.

Specific Example 2-1

Figure 10:
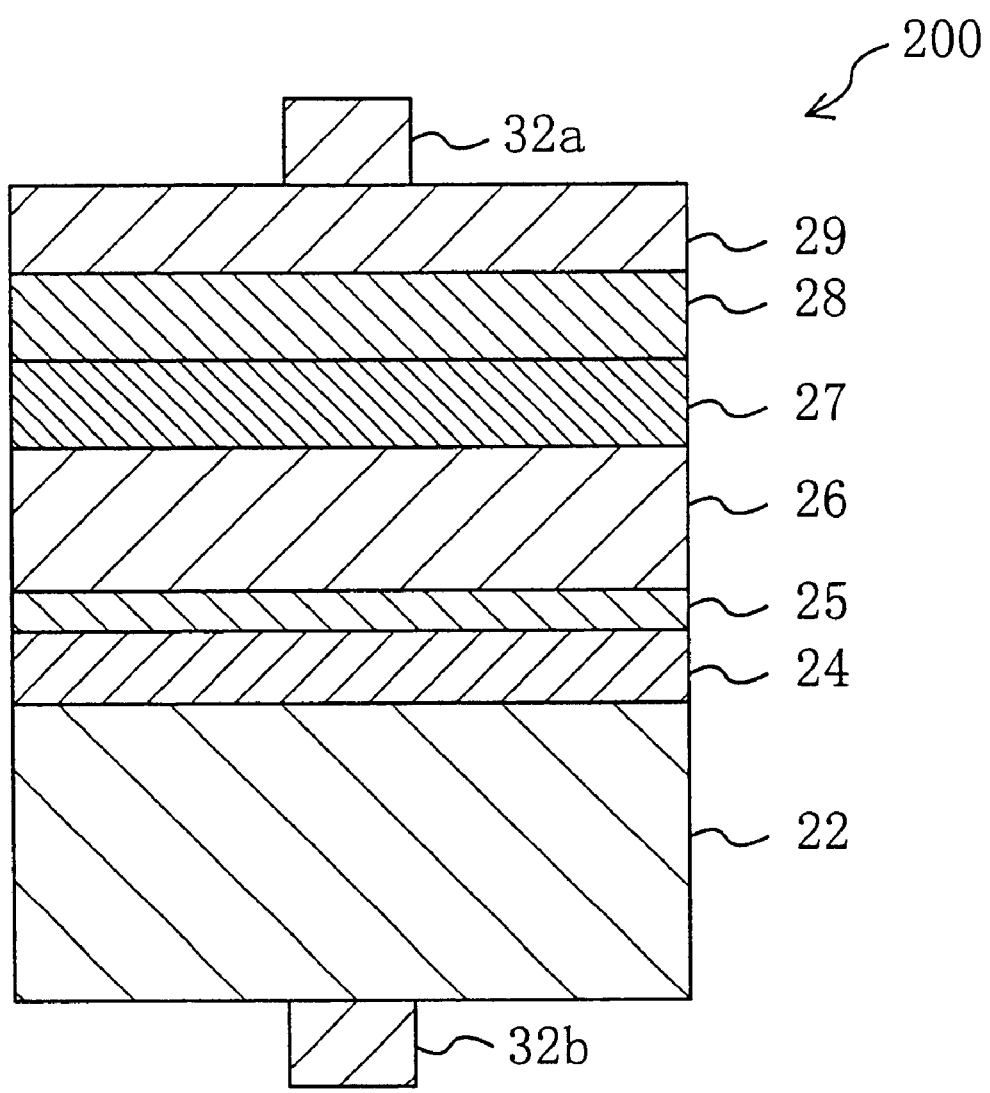
FIG. 10 is a cross-sectional view schematically illustrating a light-emitting device 200 in a first specific example of a second embodiment according to the present invention.

As shown in FIG. 10, the light-emitting device 200 according to a first specific example of the second embodiment includes: an Al single crystal layer 24 (thickness: 8 nm); an AlN single crystal layer 25 (thickness: 2 nm); an n-type $Ga_{0.9}Al_{0.1}N$ cladding layer 26 (thickness: 1 μm); an MQW active layer 27; a p-type $Ga_{0.9}Al_{0.1}N$ cladding layer 28 (thickness: 0.5 μm); and a p-type GaN contact layer 29 (thickness: 0.1 μm), which are stacked in this order on an n-type Si substrate 22. The MQW active layer 27 is formed by alternately stacking twenty pairs of undoped $In_{0.2}Ga_{0.8}N$ layers (thickness: 5 nm) and undoped GaN layers (thickness: 5 nm). Of these layers, the lowermost undoped GaN layer is in contact with the n-type $Ga_{0.9}Al_{0.1}N$ cladding layer 26.

A pair of electrodes 32a and 32b for applying a voltage to the semiconductor multilayer structure, including the n-type cladding layer 26, active layer 27, p-type cladding layer 28 and contact layer 29, which are formed on the AlN single crystal layer 25, are formed on the contact layer 29 and on the Si single crystal substrate 22, respectively, so as to face each other.

In this structure, the Al single crystal layer 24 with satisfactorily aligned crystal orientations is formed on the n-type Si single crystal substrate 22, and the AlN single crystal layer 25 is formed thereon. Accordingly, the density of defects or dislocations can be reduced in both the interface between the n-type Si single crystal substrate 22 and the Al single crystal layer 24, and the n-type $Ga_{0.9}Al_{0.1}N$ cladding layer 26, MQW active layer 27, p-type $Ga_{0.9}Al_{0.1}N$ cladding layer 28 and p-type GaN contact layer 29, which are stacked thereon. Also, heat generated in the MQW active layer 27 can be directly dissipated through the n-type Si single crystal substrate 22. Furthermore, since an electrode can be formed on the back of the n-type Si single crystal substrate 22, an increased number of light-emitting devices can be formed per substrate 22 compared to a conventional structure. That is to say, a light-emitting device can be fabricated at a lower cost.

The light-emitting device 200 may be fabricated in accordance with the crystal-growing method shown in FIGS. 3A through 3C. A method for fabricating this light-emitting device 200 will be described with reference to FIGS. 11A, 11B and 11C.

Figure 11A:
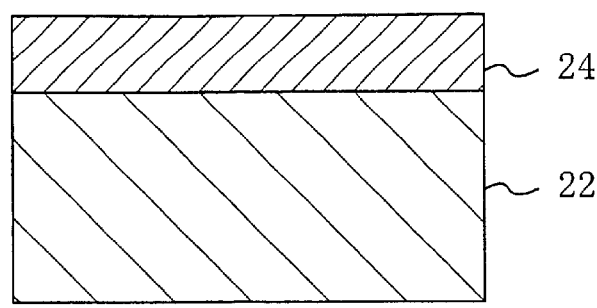
FIGS. 11A, 11B and 11C are cross-sectional views schematically illustrating a method for fabricating the light-emitting device 200 shown in FIG. 10.
Figure 11B:
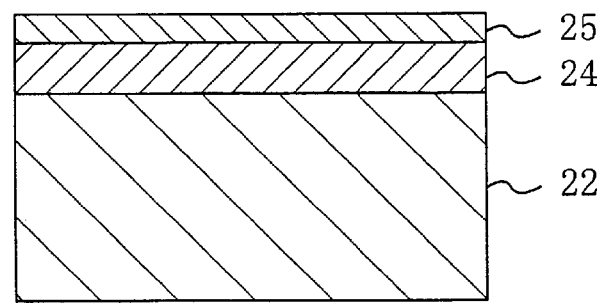

First, as shown in FIG. 11A, an Al single crystal layer 24 is deposited to be 10 nm thick on an n-type Si single crystal substrate 22 by an ICB process. Next, as shown in FIG. 8B, part of the Al single crystal layer 24 is nitrified to the depth of 2 nm as measured from the surface thereof, thereby turning that part into an AlN single crystal layer 25 with the thickness of 2 nm. The nitrification may be performed by reacting nitrogen components, which are included in a nitrogen compound such as hydrazine or ammonium contained in an appropriate carrier gas (e.g., $H_2$ gas), with the Al single crystal layer 24 while the temperature of the n-type Si single crystal substrate 22 is kept at 550° C., which is about 100° C. lower than the melting point of Al single crystals (i.e., 660° C.).

Figure 11C:
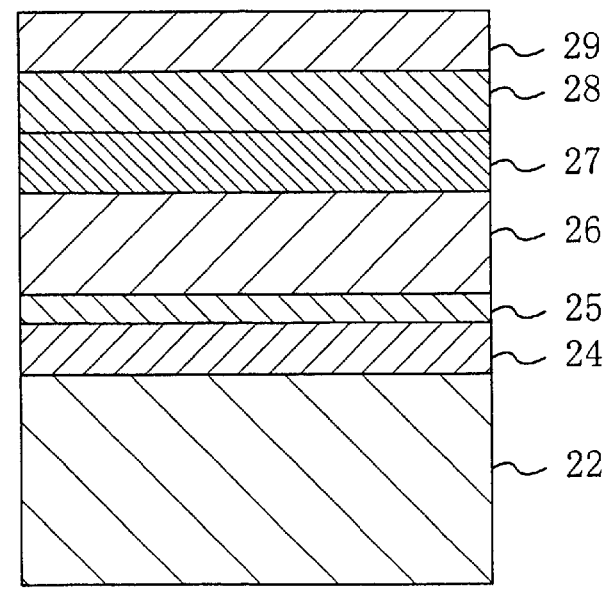

Thereafter, as shown in FIG. 11C, n-type $Ga_{0.9}Al_{0.1}N$ cladding layer 26 doped with Si, MQW active layer 27, p-type $Ga_{0.9}Al_{0.1}N$ cladding layer 28 doped with Mg and p-type GaN contact layer 29 doped with Mg are stacked in this order on the AlN single crystal layer 25 by an MOVPE process. In this process step, crystals for the n-type $Ga_{0.9}Al_{0.1}N$ cladding layer 26, p-type $Ga_{0.9}Al_{0.1}N$ cladding layer 28 and p-type GaN contact layer 29 are grown at 1000° C., while crystals for the MQW active layer 27 are grown at 800° C.

Finally, respective ohmic electrodes 32a and 32b are formed to face each other on the p-type GaN contact layer 29 and on the n-type Si single crystal substrate 22, thereby completing the light-emitting device 200. The ohmic electrode 32b may be formed of, for example, Al, Ti or Pt, with an optional annealing step at about 300° C. to about 400° C. The ohmic electrode 32b may be formed as described in Embodiment 1 of the present invention.

In this structure, since the AlN single crystal layer 25 is formed by nitrifying the Al single crystal layer 24, the Al and AlN single crystal layers 24 and 25 can be formed over the entire surface of the n-type Si single crystal substrate 22. Accordingly, the crystallinity of the n-type $Ga_{0.9}Al_{0.1}N$ cladding layer 26, MQW active layer 27, p-type $Ga_{0.9}Al_{0.1}N$ cladding layer 28 and p-type GaN contact layer 29, which are stacked on the AlN single crystal layer 25, can be improved.

The cross section of the light-emitting device 200 according to the first specific example of the second embodiment was observed with a TEM. As a result, the density of defects or dislocations in the n-type $Ga_{0.9}Al_{0.1}N$ cladding layer 26, MQW active layer 27, p-type $Ga_{0.9}Al_{0.1}N$ cladding layer 28 and p-type GaN contact layer 29 was $1.0 \times 10^5/cm^2$, which is about 1/10,000 compared to a conventional light-emitting device.

Specific Example 2-2

Figure 12:
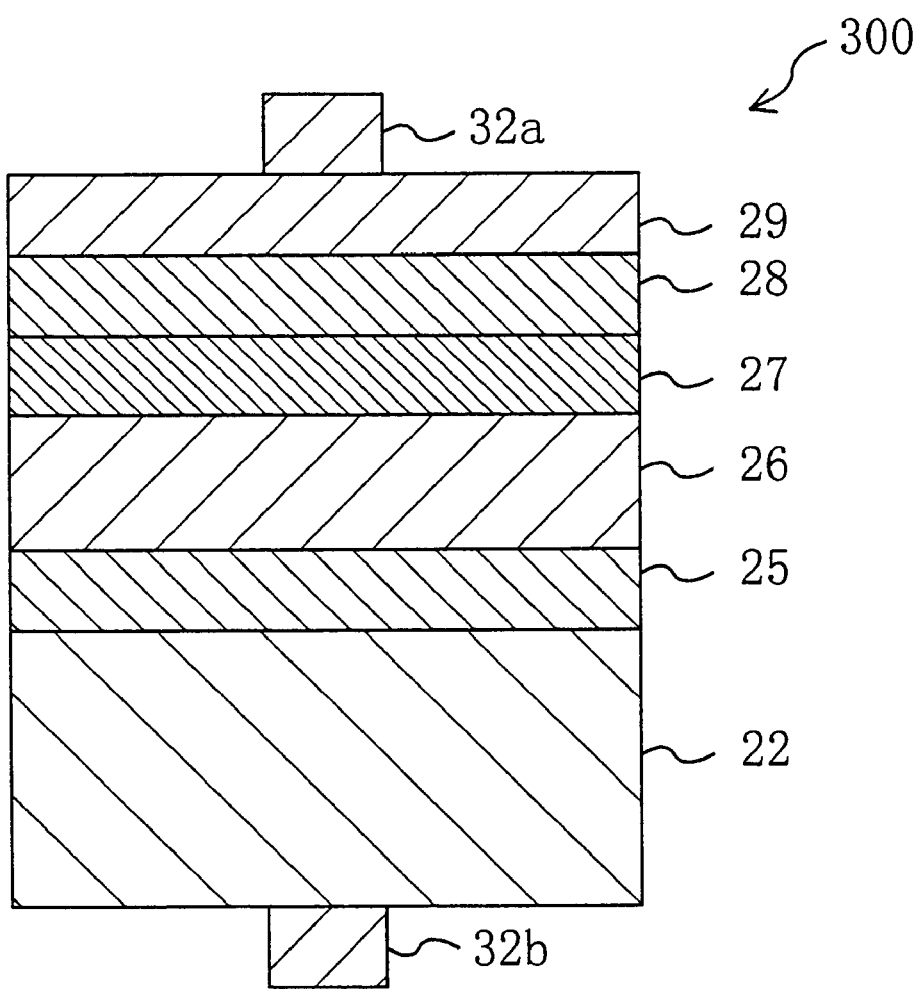
FIG. 12 is a cross-sectional view schematically illustrating a light-emitting device 300 in a second specific example of the second embodiment according to the present invention.

A light-emitting device 300 according to a second specific example of the second embodiment includes $Al_{0.9}Ga_{0.1}N$ single crystal layer 25 (thickness: 5 nm), n-type $Ga_{0.9}Al_{0.1}N$ cladding layer 26, MQW active layer 27, p-type $Ga_{0.9}Al_{0.1}N$ cladding layer 28 and p-type GaN contact layer 29, which are stacked in this order on an n-type GaAs substrate 22 as shown in FIG. 12.

In this structure, the $Al_{0.9}Ga_{0.1}N$ single crystal layer 25 with satisfactorily aligned crystal orientations is formed on the n-type GaAs substrate 22. Accordingly, the density of defects or dislocations can be reduced in both the interface between the n-type GaAs substrate 22 and the $Al_{0.9}Ga_{0.1}N$ single crystal layer 25 and the n-type $Ga_{0.9}Al_{0.1}N$ cladding layer 26, MQW active layer 27, p-type $Ga_{0.9}Al_{0.1}N$ cladding layer 28 and p-type GaN contact layer 29, which are stacked thereon. Also, heat generated in the MQW active layer 27 can be directly dissipated through the n-type GaAs substrate 22. Furthermore, since an electrode can be formed on the back of the n-type GaAs substrate 22, an increased number of light-emitting devices can be formed per substrate 22 compared to a conventional structure. That is to say, a light-emitting device can be fabricated at a lower cost.

The light-emitting device 300 is fabricated in accordance with the crystal-growing method shown in FIGS. 1A through 1C. A method for fabricating this light-emitting device 300 will be described with reference to FIGS. 8A, 8B and 8C again.

First, as shown in FIG. 8A, an $Al_{0.9}Ga_{0.1}$ alloy single crystal layer 24 is deposited to be 5 nm thick on an n-type GaAs substrate 22 by an ICB process. Next, as shown in FIG. 8B, the $Al_{0.9}Ga_{0.1}$ alloy single crystal layer 24 is nitrified to be an $Al_{0.9}Ga_{0.1}N$ single crystal layer 25. The nitrification may be performed by reacting nitrogen components, which are included in a nitrogen compound such as hydrazine or ammonium contained in an appropriate carrier gas (e.g., $H_2$ gas), with the $Al_{0.9}Ga_{0.1}$ alloy single crystal layer 24 while the temperature of the n-type GaAs substrate 22 is kept at 500° C. Thereafter, as shown in FIG. 8C, n-type $Ga_{0.9}Al_{0.1}N$ cladding layer 26 doped with Si, MQW active layer 27, p-type $Ga_{0.9}Al_{0.1}N$ cladding layer 28 doped with Mg and p-type GaN contact layer 29 doped with Mg are stacked in this order on the $Al_{0.9}Ga_{0.1}N$ single crystal layer 25 as in the first specific example.

Finally, respective ohmic electrodes 32a and 32b are formed to each face other on the p-type GaN contact layer 29 and the n-type GaAs substrate 22, thereby completing the light-emitting device 300.

In this structure, since the $Al_{0.9}Ga_{0.1}N$ single crystal layer 25 is formed by nitrifying the $Al_{0.9}Ga_{0.1}$ alloy single crystal layer 24, the $Al_{0.9}Ga_{0.1}N$ single crystal layer 25 can be formed over the entire surface of the n-type GaAs substrate 22. Accordingly, the crystallinity of the n-type $Ga_{0.9}Al_{0.1}N$ cladding layer 26, MQW active layer 27, p-type $Ga_{0.9}Al_{0.1}N$ cladding layer 28 and p-type GaN contact layer 29, which are stacked on the $Al_{0.9}Ga_{0.1}N$ single crystal layer 25, can be improved.

The cross section of the light-emitting device 300 according to the second specific example of the second embodiment was observed with a TEM. As a result, the density of defects or dislocations in the n-type $Ga_{0.9}Al_{0.1}N$ cladding layer 26, MQW active layer 27, p-type $Ga_{0.9}Al_{0.1}N$ cladding layer 28 and GaN contact layer 29 was $1.0 \times 10^5/cm^2$, which is about 1/10,000 compared to a conventional light-emitting device.

Respective lifetimes of the light-emitting devices 200 and 300 according to the first and second specific examples of the second embodiment, which were both operated at a temperature of 70° C. with an optical output of 5 mW, are substantially the same as those of the light-emitting devices E1 and E2 shown in FIG. 9. That is to say, in the light-emitting devices 200 and 300 of the second embodiment, $\Delta I/\Delta t$ is still close to 1 even after these devices have been operated for 10,000 hours. In contrast, after the conventional light-emitting device C has been operated for 5,000 hours, $\Delta I/\Delta t$ greatly deviates from 1. Accordingly, the light-emitting devices 200 and 300 of the second embodiment also have much longer lifetimes, and are a lot more reliable, than the conventional light-emitting device C. It should be noted that the oscillation wavelengths of these light-emitting devices were all 420 nm.

In the foregoing specific examples of the second embodiment, the same effects are attained if the n-type Si single crystal substrate or n-type GaAs substrate 22 is replaced with a semiconductor single crystal substrate with conductivity such as n-type GaAs substrate or n-type SiC substrate. Also, a p-type semiconductor single crystal substrate with conductivity or a conductor single crystal substrate made of a metal such as hafnium may be used instead. Among various metals, hafnium single crystals are preferable, because the lattice constant of hafnium single crystals is close to that of nitride semiconductor single crystals.

As described above, according to the second embodiment of the present invention, a metal single crystal layer and a nitride semiconductor single crystal layer are formed in this order on a conductive single crystal substrate and then semiconductor layers are formed thereon. Accordingly, heat radiation can be improved and the density of defects or dislocations in the semiconductor layers can be reduced. Furthermore, since an electrode can be formed on the back of the conductive single crystal substrate, semiconductor devices can be fabricated at a lower cost.

Specific Example 2-3

Figure 13:
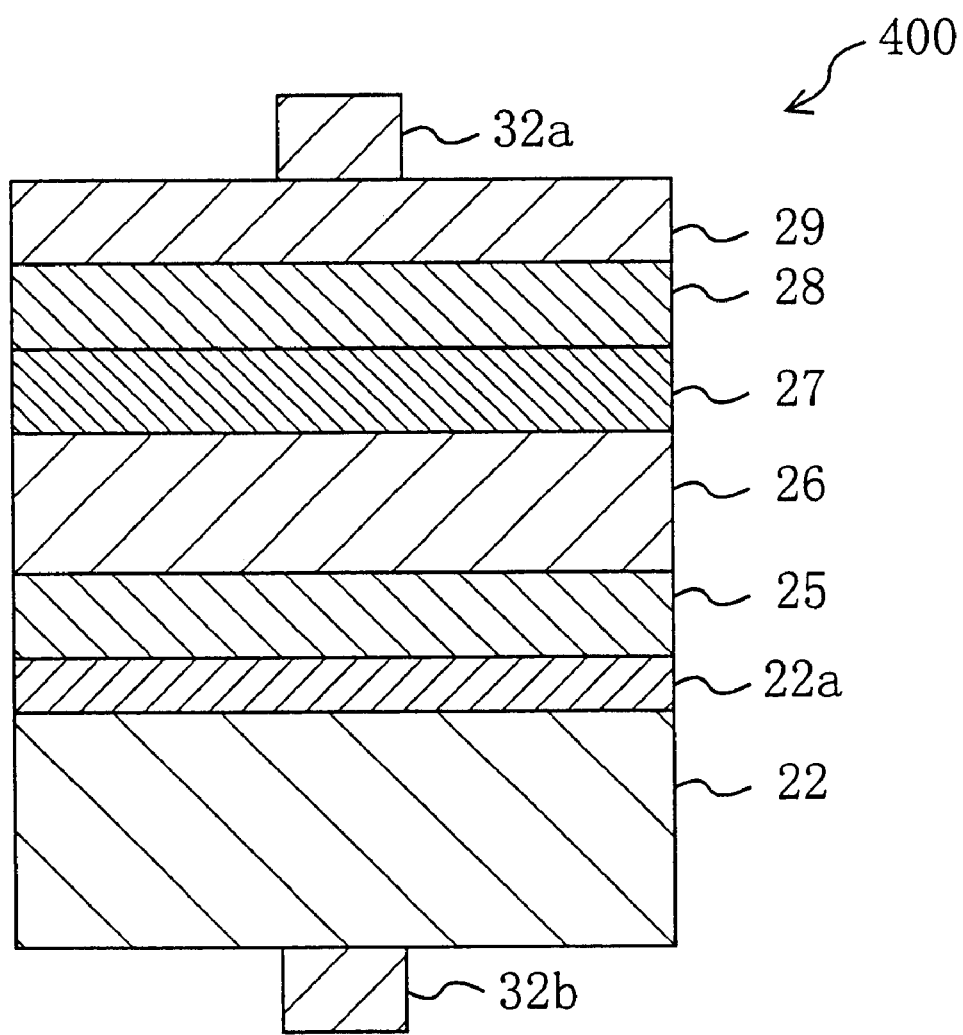
FIG. 13 is a cross-sectional view schematically illustrating a light-emitting device 400 in a third specific example of the second embodiment according to the present invention.
Figure 14:
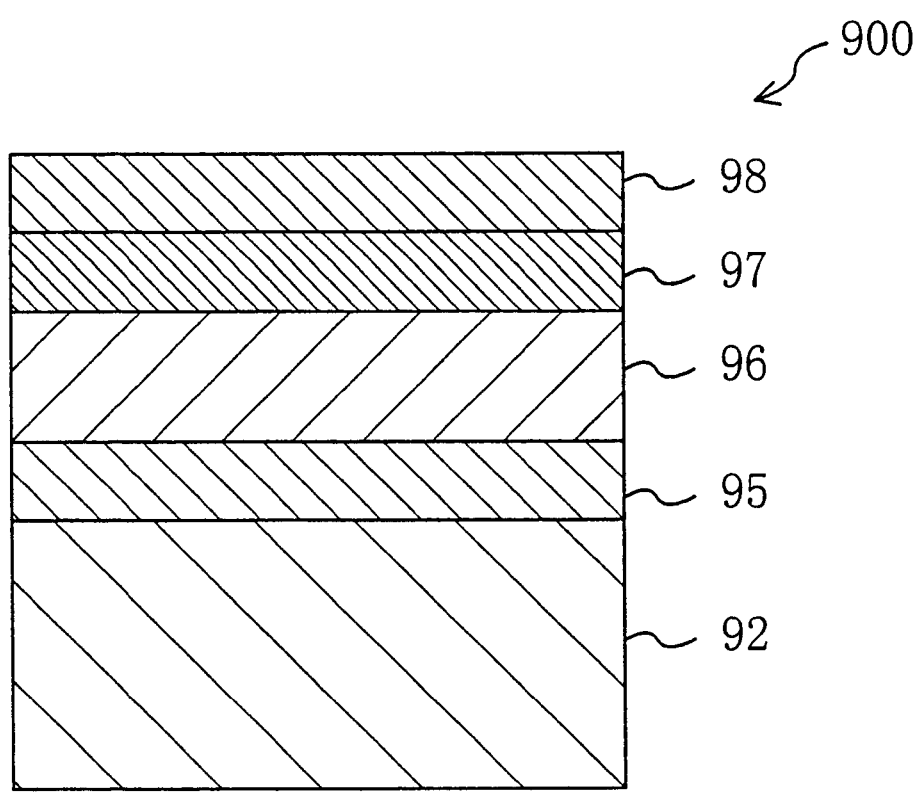
FIG. 14 is a cross-sectional view schematically illustrating a conventional light-emitting device.

A light-emitting device 400 according to a third specific example of the second embodiment includes AlN single crystal layer 25 (thickness: 5 nm), n-type $Ga_{0.9}Al_{0.1}N$ cladding layer 26, MQW active layer 27, p-type $Ga_{0.9}Al_{0.1}N$ cladding layer 28 and p-type GaN contact layer 29, which are stacked in this order on an n-type GaAs substrate 22 as shown in FIG. 13. In addition, a metal diffused layer 22a is formed within the n-type GaAs substrate 22 in the vicinity of the surface thereof closer to the AlN single crystal layer 25. The metal diffused layer 22a is formed by diffusing an alloy containing Au.

A pair of electrodes 32a and 32b for applying a voltage to the semiconductor multilayer structure, including the n-type cladding layer 26, active layer 27, p-type cladding layer 28 and contact layer 29, which are formed on the AlN single crystal layer 25, are formed on the contact layer 29 and on the n-type GaAs substrate 22, respectively, so as to face each other.

The light-emitting device 400 is fabricated in accordance with the crystal-growing method shown in FIGS. 6A through 6D.

Figure 6A:
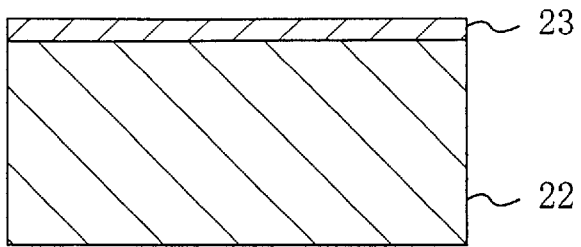
FIGS. 6A, 6B, 6C and 6D are cross-sectional views illustrating a method for growing nitride semiconductor crystals according to yet another embodiment of the present invention.

First, an n-type GaAs single crystal substrate 22, of which the principal surface is (111) plane, is prepared. On the (111) plane of the single crystal substrate 22, a metal single crystal layer 23 of an Au/Ge alloy is epitaxially grown to be about 1 nm thick by an ICB process as shown in FIG. 6A. The principal surface of the resulting AuGe single crystal layer 23 is also (111) plane.

Next, an Al single crystal layer 24 doped with Si at about $10^{18}$ cm$^{-3}$ is epitaxially grown to be about 20 nm thick on the (111) plane of the AuGe single crystal layer 23 by an ICB process. The principal surface of the resulting Al single crystal layer 24 is also (111) plane.

In epitaxially growing the metal single crystal layers 23 and 24 by an ICB process, an ICB apparatus, which includes source gas supplies (i.e., AuGe and Si-doped Al source gas supplies) for supplying the respective sources for the metal single crystal layers 23 and 24 within a single chamber and can control the flow rates of these source gases from the source gas supplies using a shutter, for example, is preferably used. If such an ICB apparatus is used, a high-purity film can be deposited, since there is no need to take out the specimens from the chamber (i.e., without breaking the vacuum within the chamber or causing leakage). The epitaxy of the metal single crystal layers 23 and 24 by the ICB process may be performed at room temperature, for example.

Figure 6B:
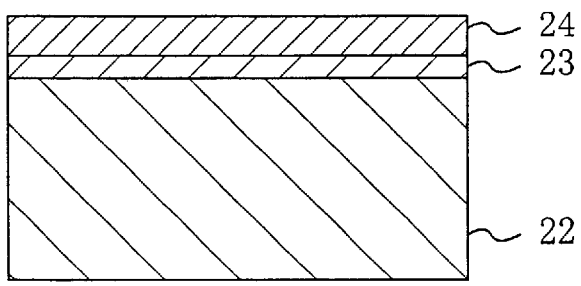
Figure 6C:
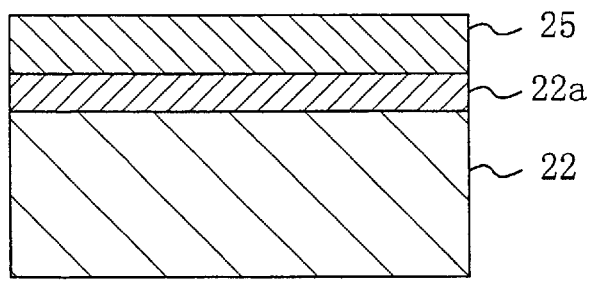

Then, while the Al single crystal layer 24 is nitrified, AuGe atoms are diffused from the AuGe single crystal layer 23 into the n-type GaAs substrate 22. In this process step, the GaAs single crystal substrate 22 is heated up to a temperature lower than the respective melting points of the GaAs single crystal substrate 22 itself and the Al single crystal layer 24 (e.g., 550° C.) and a nitrogen-containing compound gas is supplied into the chamber. The nitrogen-containing compound is preferably hydrazine or ammonium. In particular, since hydrazine has high nitrification ability, hydrazine is preferable in view of the productivity. This is because the nitrification time can be shortened and the nitrification temperature can be lowered in such a case. By nitrifying the Al single crystal layer 24 with a thickness of 20 nm for about 10 to about 15 minutes, the AlN single crystal layer 25 is formed. The principal surface of the resulting AlN single crystal layer 25 is (0001) plane. Since the thickness increases as a result of the nitrification, the AlN layer 25 is illustrated in FIG. 6B as being thicker than the Al layer 24. Also, in this process step, AuGe atoms diffuse into the n-type GaAs substrate 22 to form an AuGe diffused layer 22a as shown in FIG. 6C. To diffuse the AuGe atoms, the heating temperature and time may be adequately adjusted during the nitrification process step. Even after the nitrification reaction is substantially over, heating may be continued for the diffusion purpose only.

Figure 6D:
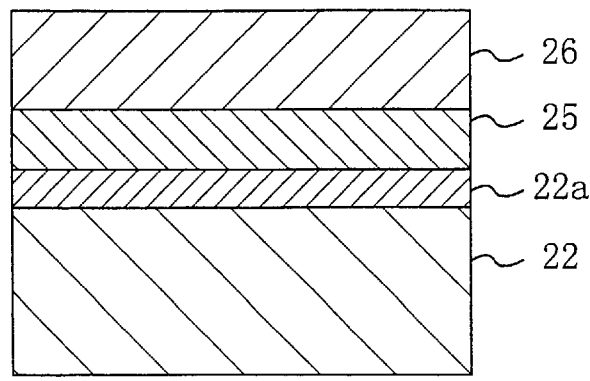

Thereafter, a cladding layer 26 of n-type $Ga_{0.9}Al_{0.1}N$ single crystals is epitaxially grown on the AlN single crystal layer 25 by an ICB process as shown in FIG. 6D. Subsequently, a double heterojunction semiconductor multilayer structure, including the n-type cladding layer 26, active layer 27, p-type cladding layer 28 and contact layer 29, is formed thereon by epitaxy as in the foregoing embodiments. And then electrodes 32a and 32b are formed to face each other on the contact layer 29 and on the n-type GaAs substrate 22, respectively. As a result, the light-emitting device 400 shown in FIG. 13 is completed. The crystal structure of the semiconductor multilayer structure is hexagonal, and a laser device can be formed with crystals cleaved on the facets of the cavity.

In the AuGe diffused layer 22a, which is formed within the n-type GaAs substrate 22 in the vicinity of the surface thereof closer to the n-type AlN layer 25, Ge atoms function as donors. Accordingly, the Ge atoms decrease the electrical resistance in the interface between the n-type GaAs substrate 22 and the n-type AlN layer 25. Thus, this light-emitting device 400, in which the pair of electrodes 32a and 32b are provided with the conductive substrate 22 and the semiconductor multilayer structure interposed therebetween, can have its operating voltage reduced.

In this third specific example of the second embodiment, if a p-type GaAs substrate is used as the conductive single crystal substrate 22 and AuNi single crystal layer and Mg-doped (e.g., about 0.5 mol %) Al single crystal layer are used as respective metal single crystal layers 23 and 24, then a p-type AlN layer 25 can be formed over the p-type GaAs substrate 22. Accordingly, a light-emitting device can be fabricated with a reversed arrangement of conductivity types in the double heterostructure. In this reversed arrangement, an AuNi diffused layer 22a is formed within the p-type GaAs substrate 22 in the vicinity of the surface thereof closer to the p-type AlN layer 25. Ni atoms in the AuNi diffused layer 22a function as acceptors, thus decreasing the electrical resistance in the interface between the p-type GaAs substrate 22 and the p-type AlN layer 25. As a result, the light-emitting device can operate at a lower voltage.

In this specific example, the metal single crystal layer 23 may be made of element Au or any other alloy containing Au.

According to the inventive method for growing nitride semiconductor crystals, a nitride semiconductor layer is epitaxially grown on a metal nitride single crystal layer obtained by nitrifying a metal single crystal layer. Therefore, a nitride semiconductor layer is obtained with a much smaller number of dislocations or defects than that formed by a conventional crystal growing method.

In addition, a highly reliable nitride semiconductor device with a longer lifetime can be obtained by fabricating the semiconductor device using the method for growing nitride semiconductor crystals according to the present invention. The inventive method for growing nitride semiconductor crystals is advantageously applicable to a method for fabricating a blue light emitting laser diode.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A nitride semiconductor device comprising:

a single crystal substrate;

a metal nitride single crystal layer formed by nitrifying a metal single crystal layer on the single crystal substrate;

a semiconductor multilayer structure including a first nitride semiconductor layer epitaxially grown on the metal nitride single crystal layer; and a pair of electrodes for applying a voltage to the semiconductor multilayer structure.

2. A nitride semiconductor device comprising:

a single crystal substrate with conductivity;

a metal nitride single crystal layer formed by nitrifying a metal single crystal layer on the single crystal substrate;

a semiconductor multilayer structure including a first nitride semiconductor layer epitaxially grown on the metal nitride single crystal layer; and a pair of electrodes formed to face each other on respective surfaces of the single crystal substrate and the semiconductor multilayer structure, which are interposed between the surfaces.

3. The device of claim 1, further comprising a first metal single crystal layer on the single crystal substrate, and wherein the metal nitride crystal layer is formed by nitrifying a second metal single crystal layer epitaxially grown on the first metal single crystal layer.

4. The device of claim 1, wherein the single crystal substrate comprises a metal diffused layer in which metal atoms have diffused from the metal nitride single crystal layer.

5. The device of claim 1, wherein the single crystal substrate comprises a metal diffused layer in which metal atoms have diffused from the first metal single crystal layer.

6. The device of claim 1, wherein the single crystal substrate is made of $Si_{1-s-t}Ge_sC_t$ (where $0 \leq s$, $t \leq 1$ and $0 \leq s+t \leq 1$).

7. The device of claim 1, wherein the single crystal substrate is made of $A_{1-u}B_u$, where $0<u<1$, A is one of Al, Ga and In and B is one of As, P and Sb.

8. The device if claim 1, wherein the single crystal substrate is made of a material selected from the group consisting of: sapphire; spinel; magnesium oxide; zinc oxide; chromium oxide; lithium niobium oxide; lithium tantalum oxide; and lithium gallium oxide.

9. The device of claim 5, wherein the first metal single crystal layer is made of Au or an alloy containing Au.

10. The device of claim 1, wherein the metal nitride single crystal layer is made of $Al_{1-x-y}Ga_xIn_yN$ (where $0 \leq x$, $y \leq 1$ and $0 \leq x+y<1$).

11. The device of claim 10, wherein the single crystal substrate is a single crystal substrate of silicon, of which the principal surface is (III) plane, and wherein the metal nitride single layer is formed on the (III) plane and the principal surface of the metal nitride single crystal layer is (0001) plane.

* * * * *